United States Patent
Slobodnik et al.

(10) Patent No.: US 7,269,766 B2
(45) Date of Patent: Sep. 11, 2007

(54) METHOD AND APPARATUS FOR MEMORY SELF TESTING

(75) Inventors: Richard Slobodnik, Austin, TX (US);
Stephen John Hill, Austin, TX (US);
Gerard Richard Williams, Sunset Valley, TX (US)

(73) Assignee: ARM Limited, Cambridge (GB)

( * ) Notice: Subject to any disclaimer, the term of this patent is extended or adjusted under 35 U.S.C. 154(b) by 775 days.

(21) Appl. No.: 10/025,816

(22) Filed: Dec. 26, 2001

(65) Prior Publication Data

US 2003/0120985 A1    Jun. 26, 2003

(51) Int. Cl.
*G11C 29/00* (2006.01)
(52) U.S. Cl. .............. 714/718; 714/719; 714/720
(58) Field of Classification Search ........ 714/701, 714/702, 718–720, 725, 733; 365/200, 230.06, 365/201; 438/11
See application file for complete search history.

(56) References Cited

U.S. PATENT DOCUMENTS

| 5,535,164 | A |   | 7/1996  | Adams et al.       |         |
|-----------|---|---|---------|--------------------|---------|
| 5,633,877 | A |   | 5/1997  | Shephard, III et al. |       |
| 5,661,732 | A | * | 8/1997  | Lo et al.          | 714/725 |
| 6,001,662 | A | * | 12/1999 | Correale et al.    | 438/11  |
| 2001/0011904 | A1 |   | 8/2001 | Kaiser et al.     |         |
| 2003/0167428 | A1 | * | 9/2003 | Gold              | 714/720 |

FOREIGN PATENT DOCUMENTS

EP    0 472 818    3/1992

* cited by examiner

*Primary Examiner*—Guy Lamarre
*Assistant Examiner*—John J. Tabone, Jr.
(74) *Attorney, Agent, or Firm*—Nixon & Vanderhye P.C.

(57) ABSTRACT

A self-test controller 10 is responsive to scanned in self-test instructions to carry out test operations including generating a sequence of memory addresses that is specified by the self-test instruction. Combining multiple such self-test instructions allows a custom test methodology to be built up by a user using a generic self-test controller 10.

34 Claims, 6 Drawing Sheets

METHOD AND APPARATUS FOR MEMORY SELF TESTING

BACKGROUND OF THE INVENTION

1. Field of the Invention

This invention relates to the field of data processing systems. More particularly, this invention relates to the self-testing of memories within data processing systems to detect memory defects.

2. Description of the Prior Art

It is known to provide data processing systems incorporating memories with self-testing mechanisms, sometimes termed built-in self-test (BIST), such that when the memory circuits have been fabricated they may conduct a self-test or series of self-tests to determine if there are any memory defects present that would indicate that the circuit should be rejected. It is important that memory circuits should be highly reliable and that defective circuits should be effectively identified. As memory sizes increase, the proportion of the die being taken up by the memory is also increasing and, furthermore, the high transistor density within memory means that the defect density of these memories is becoming increasingly significant.

The type of defect that can arise may vary significantly from design to design and with different fabrication processes applied to the same design. For this reason, self-test methodologies are normally selected and tuned to a particular design and fabrication technique by the manufacturer concerned. A manufacturer will typically have their own preferred test methodology that experience has told them is well suited to their particular environment to identify defective memories. The test methodology adopted by one manufacturer may well not work well for another manufacturer.

It will be appreciated that self-test circuits whilst necessary to ensure a memory has been correctly fabricated, do represent a circuit area overhead that should be desirably reduced. The self-test circuits are typically used when an integrated circuit is manufactured but thereafter are not used during the normal operation of the integrated circuit.

SUMMARY OF THE INVENTION

Viewed from one aspect the present invention provides apparatus for processing data, said apparatus comprising:

at least one memory having a plurality of memory storage locations associated with respective memory addresses; and a self-test controller operable to control self-test of said at least one memory; wherein said self-test controller is responsive to a self-test instruction to perform at least one memory access to each memory location within a sequence of memory storage locations, memory address changes between successive memory locations accessed within said sequence of memory storage locations being selected in dependence upon said self-test instruction such that said self-test controller may be configured by said self-test instruction to implement different memory test methodologies.

The invention recognizes that in some circumstances a programmable self-test controller that allows different test methodologies to be performed by varying the address sequencing is desirable. In particular, providing a self-test controller that is programmable in this way enables the design of the self-test controller to be reused by various different manufacturers and yet allows those manufacturers to program the self-test controller to carry out a test methodology they select as best suited to their particular circumstances. Whilst providing a programmable self-test controller as opposed to one that can carry out merely one fixed test methodology does slightly increase the size and complexity of the self-test controller in a manner that would generally be regarded as disadvantageous, in practice this disadvantage is more than outweighed by the ability to reuse the self-test controller design to cope with the different test requirements of different manufacturers or the different test requirements that may arise for a single manufacturer as they evolve their own fabrication processes.

Whilst it would be possible for the self-test instructions to represent complete test methodologies, in preferred embodiments of the invention a plurality of self-test instructions are executed to perform a sequence of memory tests that may be adjusted to allow different sequences to be specified by different users. The self-test controller is effectively driven by a program of self-test instructions to carry out whatever test methodology is desired by a particular user.

It will be appreciated that the sequence of memory tests may be adjusted to suit the particular type of memory being tested or to suit a particular fabrication test methodology.

It will be appreciated that the memory addresses that are produced by the self-test controller could take a variety of forms and be mapped to the memory locations in different ways. However, many types of memory defects are associated with the physical location of a memory location in itself or relative to other memory locations and accordingly memory addresses that directly represent row and column addresses that give a physical position for the memory location are particularly well suited for generation by the self-test controller since the sequences of memory addresses that are useful in testing will generally be more easily formed when the memory addresses are represented in this way.

An important consideration with such a programmable self-test controller is deciding which addresses sequences and tests should be supported by the instructions provided. The instructions should be selected such that they can be combined in a wide range of different ways to provide a broad coverage of possible test methodologies that can encompass the requirements of many different situations. Weighed against this requirement, the greater the number of self-test instructions supported and the complexity of the tests they represent, the greater will be the complexity and overhead associated with the self-test controller. With the above factors in mind, preferred embodiments of the invention incorporate self-test instructions allowing the following test operations to be performed:

(i) write specified data to all memory locations within a range of memory addresses;

(ii) read data from all memory locations within a range of memory addresses;

(iii) write specified data to memory locations having a checkerboard pattern of memory addresses;

(iv) read data from memory locations having a checkerboard pattern of memory addresses;

(v) conduct a march C memory test;

(vi) read data from and write specified data to a sequence of memory locations within a memory arranged in rows and columns of memory locations such that memory locations within a row of memory locations are accessed in turn before a next row of memory locations is selected for access;

(vii) read data from and write specified data to a sequence of memory locations within a memory arranged in rows and columns of memory locations such that memory locations within a column of memory locations are accessed in turn before a next column of memory locations is selected for access;

(viii) read data from, write specified data to and read data from a sequence of memory locations within a memory arranged in rows and columns of memory locations such that memory locations within a row of memory locations are accessed in turn before a next row of memory locations is selected for access;

(ix) read data from, write specified data to and read data from to a sequence of memory locations within a memory arranged in rows and columns of memory locations such that memory locations within a column of memory locations are accessed in turn before a next column of memory locations is selected for access;

(x) for a sequence of memory locations, repeatedly write a value to one or more bitlines within said memory and then read a complementary value stored within a memory location sharing said one or more bitlines; and (xi) for a sequence of memory locations, repeatedly read a value from a memory location while interjecting opposing data writes;

(xii) a predetermined combination of memory test operations as defined in (i) to (xi) for go/nogo testing where manufacture's test methods do not have specific requirements; and (xiii) creating false read data at specific points in order to validate fail detection.

The invention is particularly well suited to use with embodiments in which the self-test controller, the one or more memories and a processor core are formed together on an integrated circuit. The increased use of relatively large amounts of memory fabricated on the same integrated circuit as a processor core leads to an increase in the need to support a larger number of test methodologies since the number of manufacturers of components incorporating significant amounts of memory is increased and the variations in the fabrication characteristics applied to different integrated circuits also increases. Looked at in another way, the technique responds to the change whereby memory is less frequently provided in the form of discrete integrated circuits produced by specialist memory manufacturers and is more generally incorporated within a single integrated circuit together with various other components, particularly processor cores, by a wider range of manufacturers, such as ASIC producers.

It will be appreciated that the memories to be tested could take a variety of different forms. In particular, the memories could be custom memories or synthesized memories depending upon the particular circumstances, each of these different types potentially require different test methodologies that are facilitated by the programmable nature of the self-test controller.

A further complication with the present technique is that different memories may require different signal values and timings in order to drive them. The desire to provide a generic self-test controller of a comparatively simple design makes it impractical to deal with such differences within the self-test controller. Accordingly, preferred embodiments of the invention include an interface circuit that performs any necessary signal value and timing adjustments required between the self-test controller and the memory under test. Concentrating the circuit elements required to connect to a particular memory together within an intervening interface circuit allows the design of the self-test controller to remain generic and relatively compact.

As well as specifying a memory address sequence to be used, a self-test instruction may also additionally specify a data value to be written to a memory during testing. The data value selection can have an important influence upon the type of defects detected by a particular test and may be used to probe the potential vulnerabilities of memories in a way that may be configured by the particular manufacturer or user.

It will be appreciated that many modern integrated circuits often include multiple different memories. These different memories may have quite different designs and require different test methodologies. The programmable nature of the self-test controller allows this single circuit to test such different memories in a way best suited to the particular memory concerned. The self-test instructions may also specify the way in which any detected errors are to be reported. This is an advantageous feature that allows the error reporting to be tuned to a particular manufacturer's requirement or even to reflect different test environments, such as design debugging compared with manufacturing test.

Additional data may be recovered concerning detected errors if the interface circuit is provided with a storage which may be accessed under control of a self-test instruction. This simplifies the interface between the self-test controller and the memory and yet allows powerful diagnostic or other data to be captured if a particular user or design makes this desirable.

In order to efficiently deal with the common circuit variant of differing memory sizes, such as different cache sizes or on-chip RAM sizes, preferred embodiments provide that the self-test instruction should specify the size of the memory being tested.

In order to reduce the connection overhead associated with the self-test controller preferred embodiments serially load the self-test instructions into the self-test controller.

The self-test controller is desirably provided with a plurality of external signal pins on the integrated circuit package to facilitate manufacturing test in a way that is independent of other circuit elements.

Viewed from another aspect the present invention provides a method of testing a memory having a plurality of memory storage locations associated with respective memory addresses, said method comprising the steps of:

passing a self-test instruction to a self-test controller coupled to said memory; and in response to said self-test instruction, performing at least one memory access to each memory location within a sequence of memory storage locations, memory address changes between successive memory locations accessed within said sequence of memory storage locations being selected in dependence upon said self-test instruction such that said self-test controller may be configured by said self-test instruction to perform different memory test methodologies.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
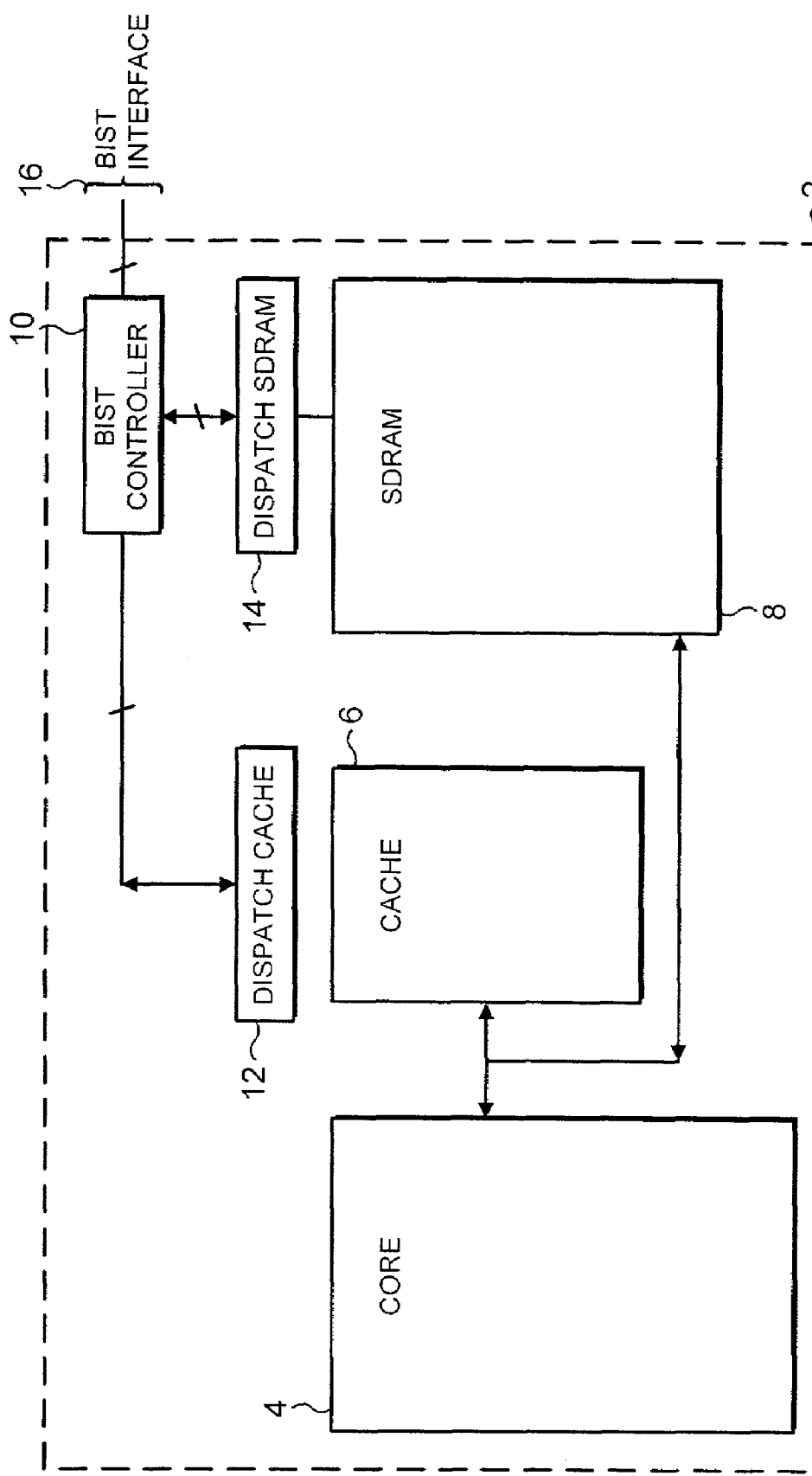
FIG. 1 schematically illustrates an integrated circuit incorporating a processor core, multiple memories and a self-test controller.

FIG. 1 shows an integrated circuit 2 incorporating a processor core 4, a cache memory 6 and an RAM memory 8 (in this example SDRAM). It will be appreciated that such an integrated circuit 2 will typically include many more circuit elements, but these have been omitted from this drawing for the sake of simplicity and clarity.

A self-test controller 10 is provided on the integrated circuit 2 and communicates with each of the cache memory 6 and the SDRAM memory 8 by a respective dispatch circuit 12, 14. These dispatch circuits act as interface circuits between the self-test controller 10 and the respective memories. Thus, generic memory test driving signals produced by the self-test controller can be re-mapped to logical addresses and adjusted in value and timing to the requirements of the different memories without a need to change the fundamental design of the self-test controller 10.

It will also be seen that the self-test controller 10 includes a self-test interface 16 provided in the form of multiple external signal pins of the integrated circuit 2. In this way, when the integrated circuit 2 has been fabricated, it may be plugged into an appropriate test controller that initiates the self-test action of the self-test controller 10 and responds to any detected memory defects by either rejecting the integrated circuit 2 as a whole or applying appropriate repairs in circuits where this is possible.

Figure 2:
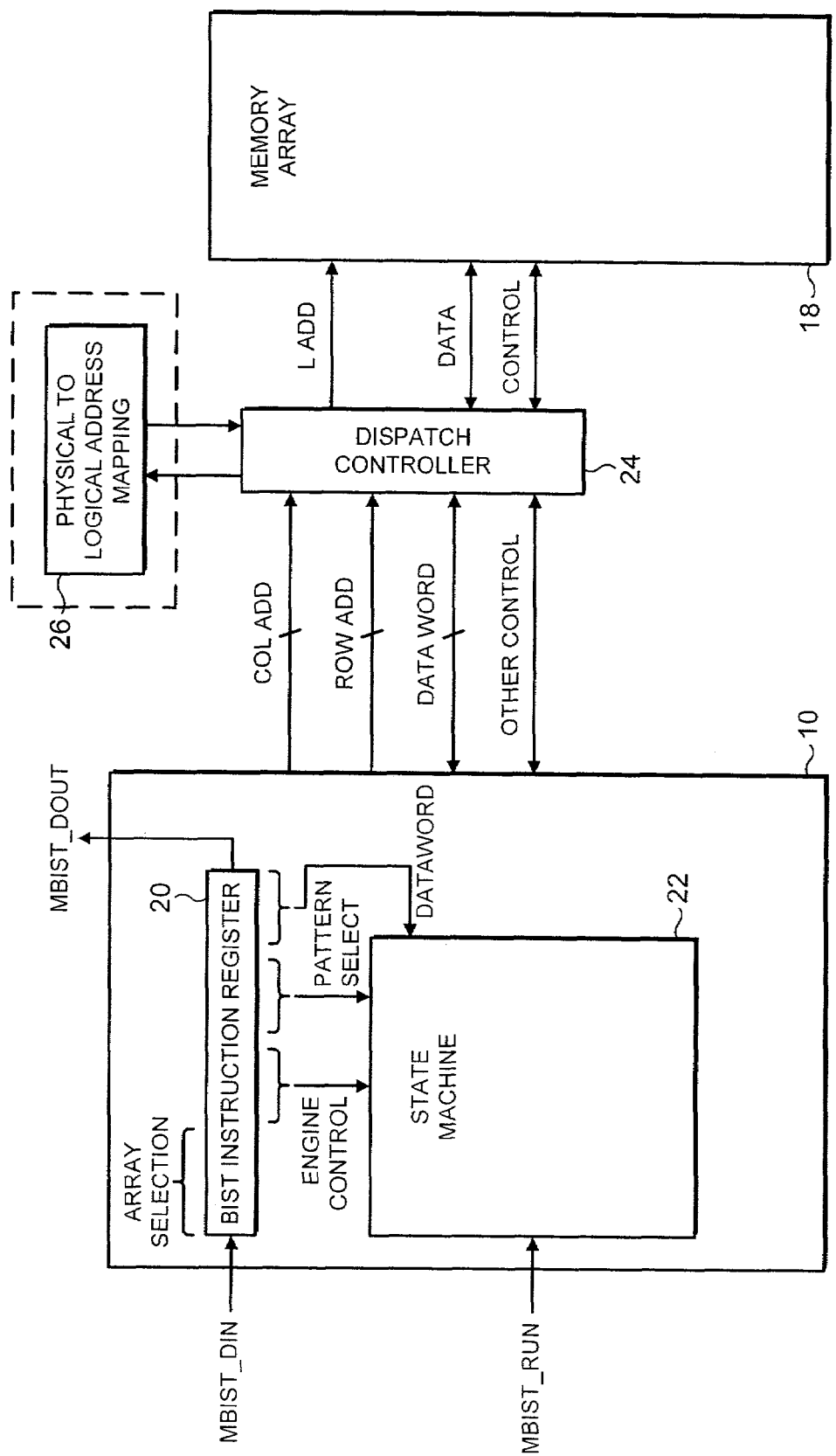
FIG. 2 schematically illustrates a self-test controller, an interface circuit and a memory in more detail.

FIG. 2 schematically illustrates the relationship between the test controller 10 and a memory device 18 in more detail. The self-test controller 10 includes a self-test instruction register 20 into which self-test instructions can be loaded via the self-test interface 16 using serial shifting techniques. Once the self-test instruction is in place, self-test action may be triggered by assertion of an appropriate externally applied signal, such as MBIST_RUN. Within the self-test controller 10 a state machine 22 is responsive to a pattern selection portion of the self-test instruction which serves to select which physical memory address sequence will be generated by the self-controller 10 for application to the memory device 18. As examples, the patterns selected may serve to perform the following actions:

write a specified data word into all entries;

read a data word from all entries;

write a data word or inverse data word in a checkerboard pattern into all entries;

read a data word or inverse data word in a checkerboard pattern from all entries;

perform a march C test (this type of test is well known in the memory test field and will not be described herein further);

perform a read operation and then a write operation using an increment decrement word line fast march;

perform a read operation and then a write operation using an increment decrement bit line fast march;

perform a read operation, a write operation and a read operation using an increment decrement word line fast march;

perform a read operation, a write operation and a read operation using an increment decrement bit line fast march;

perform a "bang" test which serves to stress test bit line pairs by repeated write operations and read operations;

perform a predefined suite of tests (such as those mentioned above) to yield a perform a pattern which creates false read data at specific points in order to validate fail detection.

The data word that may be applied as part of the above described techniques is also supplied as a bit field within the self-test instruction. An engine-control field within the self-test instruction serves to define error reporting options for the self-test controller 10 and self-test system as a whole. An array selection portion of the self-test instruction serves to select which particular memory device is to be tested with the self-test instruction concerned in an environment containing multiple memory devices. It will be appreciated that a self-test instruction could be applied to multiple memory devices in parallel in appropriate circumstances.

The self-test controller 10 generates physical memory address signals in the form of column address signals and row address signals that are passed to a dispatch controller 24. The data word to be applied in the specified test is also passed to the dispatch controller 24. Various other control signals are also exchanged between the self-test controller 10 and the dispatch controller 24.

The dispatch controller 24 acts as an interface circuit for applying any necessary signal value adjustments or timing adjustments to the signals generated by the generic self-test controller 10 that are required in order to drive the desired test within the memory device 18. As an example, different latencies of signals may be accommodated by incorporating different lengths of pipeline delay between memory access instructions being received and being serviced. A further significant role of the dispatch controller 24 is to map the physical memory address signals generated by the self-test controller 10 into required logical memory address signals that may drive the memory device 18. In the case where the dispatch controller 24 has been specifically designed for the particular memory device 18, then this mapping may be incorporated into that design. In other embodiments, it may be that the dispatch controller 24 itself is generic to some degree and it is desirable to be able to deal with different mappings that may be necessary. This may be optionally accommodated by latching the physical memory address signals, supplying these to a further separately designed and provided mapping circuit 26, before the desired logical memory address signals are returned and latched within the dispatch controller 24. This separately provided mapping circuit 26 is illustrated within a dotted line within FIG. 2 to demonstrate its optional character. It will be appreciated that the mapping circuit may be separately provided in this way or may be incorporated within the dispatch controller 24. Both of these possibilities are encompassed within the present technique.

The dispatch controller 24 provides signal values necessary to drive the test within the memory device 18. These signals include a logical address value, a data value, which will typically be an expanded form of the data word as specified within the self-test instruction, and any associated control signals. The dispatch controller 24 will also monitor the response of the memory device 18 to the requested memory access operations and report detected memory defects, such as an incorrect data bit being read back, to the self-test controller 10. The dispatch controller 24 may include data registers that serve to log data specifying any detected errors or other parameters. This data may be read from the dispatch controller 24 to the outside environment using an appropriate self-test instruction scanned into the self-test controller 10 after the testing is complete. This type of operation is particularly useful in design debugging where a fine level of detail regarding detecting errors may be required.

Figure 3:
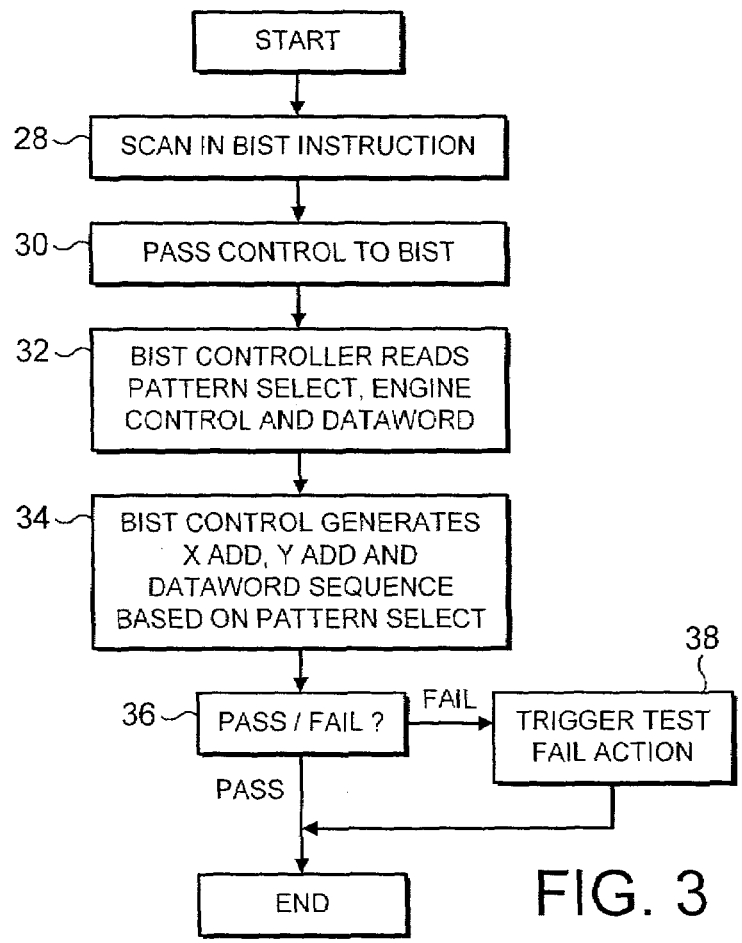
FIG. 3 is a flow diagram schematically illustrating the use of the self-test controller of FIG. 2.

FIG. 3 is a flow diagram schematically illustrating operation of the embodiments illustrated in FIGS. 1 and 2. At step 28 a self-test instruction is serially loaded into the self-test controller 10. At step 30 control is passed to the self-test controller 10 by the external application of the MBIST_RUN signal illustrated in FIG. 1. At step 32, the state machine 22 within the self-test controller reads the pattern select bits, the engine control bits and the data word bits from the self-test instruction stored within the self-test instruction register 20 and then generates the specified test signals at step 34. It will be appreciated that the self-test instruction will typically specify a long sequence generating many thousands of physical memory address signal values and data values to be applied to the memory device under test to carry out at least part of a desired test methodology.

After the particular self-test instruction has completed execution, a test at step 36 is made as to whether a pass result or a fail result has been returned. If a fail result has been returned, then processing proceeds to step 38 at which any desired fail action is triggered. If the result was a pass then the processing of the particular self-test instruction terminates directly.

It will be appreciated that the flow diagram of FIG. 3 illustrates the execution of a single self-test instruction. In practice, a test methodology will typically be built up by a manufacturer or user in the form of a long sequence of such self-test instructions as required to specify a test methodology specially adapted to that particular design and fabrication environment. Thus, multiple self-test instructions will be loaded into the self-test controller 10 and multiple passes through the processing illustrated in FIG. 3 will be made. Data retention, read disturb and iddq testing are supported to be controlling the pattern set.

It will be appreciated that some users may not wish to custom specify their own test methodology and accordingly may rely upon the default test methodology mentioned above which could be specified using a single self-test instruction and return a single simple go/nogo result value.

Figure 4:
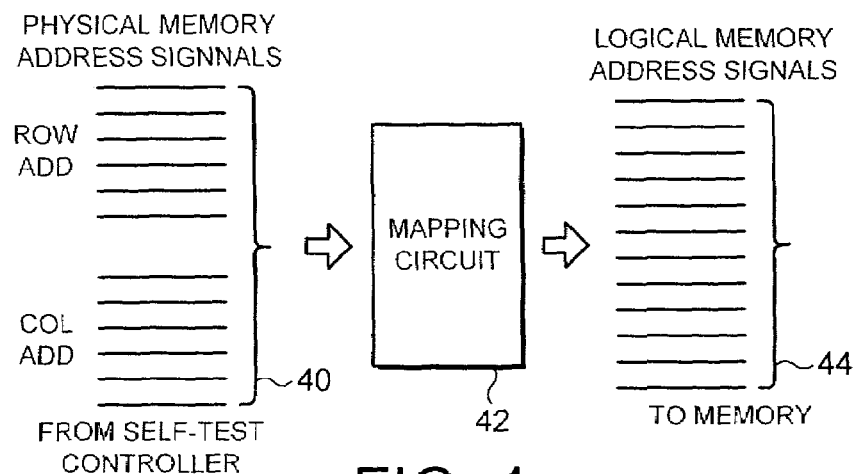
FIG. 4 schematically illustrates a mapping of physical memory address signals to logical memory address signals.

FIG. 4 illustrates the receipt of physical memory address signals 40 from the self-test controller 10. These are manipulated by a mapping circuit 42 to generate appropriate logical memory address signals 44 that can drive the memory device under test. In a simple arrangement there may be a one to one mapping of the physical memory address signals to the logical memory address signals. However, in more complicated situations the relationship between physical memory address signals and logical memory address signals may be more complex, but nevertheless readily achievable with a comparatively simple and easy to design mapping circuit 42.

Figure 5:
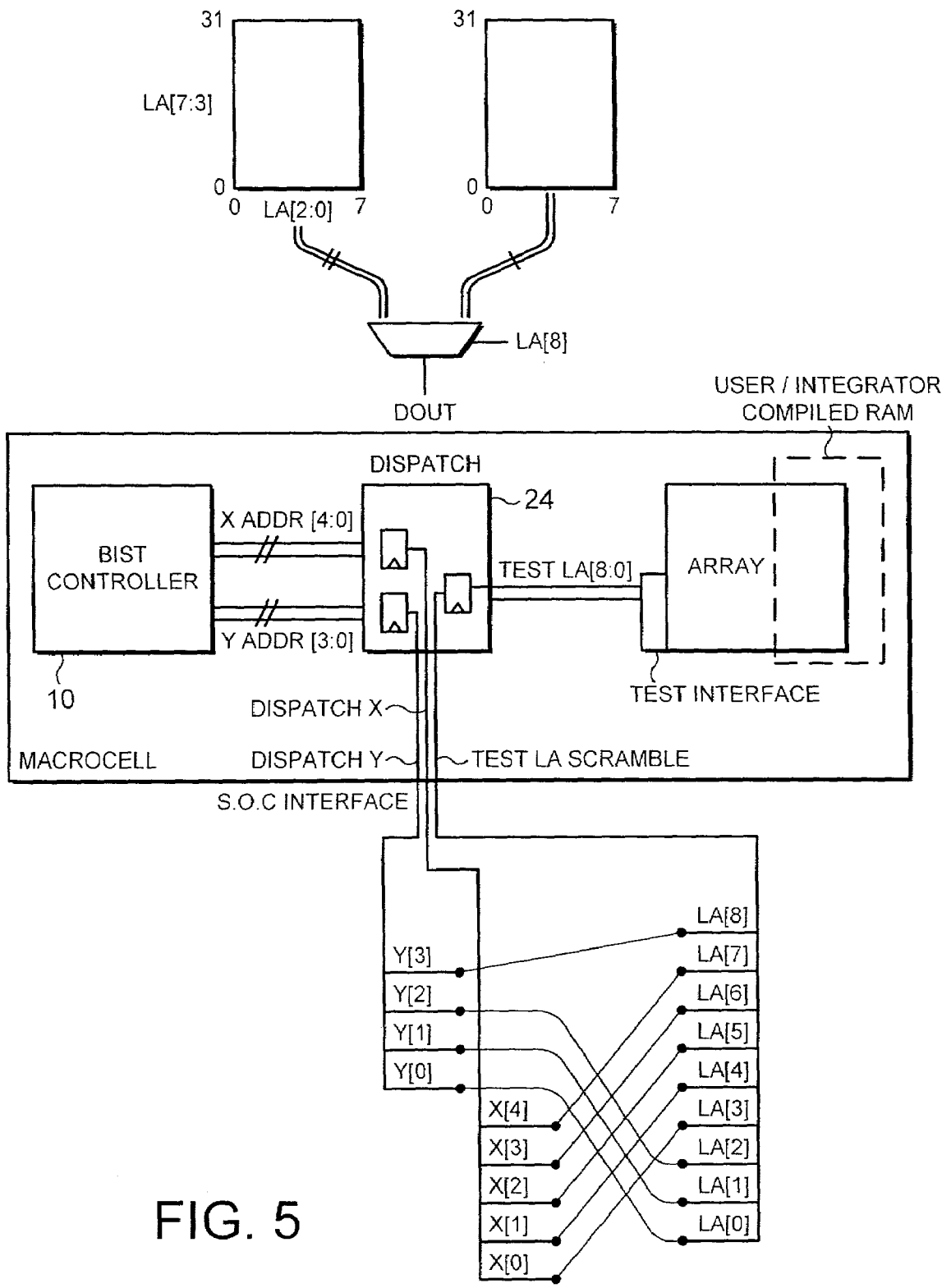
FIG. 5 illustrates in more detail a particular example of an address signal mapping that may be required.

FIG. 5 illustrates an example of an address signal mapping that may be provided. The memory device under test is formed of two memory arrays each containing 32 rows and 8 columns. The logical address is a 9-bit value. The most significant logical address bit LA[8] is used to control a multiplexer to select between the two arrays of memory. The least significant 3-bits of the logical address LA[2:0] is used to select the column. The remaining logical address bits LA[7:3] are used to select the row. This relationship and arrangement is illustrated at the top of FIG. 5.

The middle portion of FIG. 5 is similar to FIG. 2. This illustrates a macrocell which may be part of a SOC design (and have its own an SOC interface), which also includes a self-test controller 10, a dispatch controller 24 as well as the memory device formed of the two blocks as discussed above. The self-test controller 10 treats the memory device as an array of memory locations having 32 rows as represented by the 5-bit row address Xaddr. The column of the memory locations is expressed as the Yaddr 4-bit address irrespective of whether this column is in the lower order block or the higher order block within the physical device. In the example of FIG. 5 the mapping circuit is provided externally of the dispatch controller 26 via a custom circuit attached to the SOC interface. Attaching the custom mapping circuit at this level allows easy alteration to this circuit and design of this circuit. In the example illustrated, the physical memory address signals are latched within the dispatch circuit 24 and then passed out to the separate mapping circuit. Within the mapping circuit the least significant 3-bits of the Yaddr field form the least significant 3-bits of the logical address LA[2:0]. The most significant bit of the Yaddr value forms the most significant bit LA[8] of the logical address. The row address 5-bit value Xaddr forms the bits LA[7:3] of the logical address. The logical address LA [8:0] built up in this way is passed back from the mapping circuit into the dispatch controller 24 and again latched prior to being applied to the memory device to perform the desired test.

A further more detailed description of the above techniques is given as follows:

This specification provides an outline for implementation of memory BIST in both hard and soft core products. This specification will act as a blueprint for all new within ARM with the end goal of creating a re-useable and constant memory BIST architecture and memory BIST interface for all customers (ARM internal included).

The memory BIST architecture will require functionality to exist in both hard and soft cores since it is ARM's desire to place memory test interfaces in non-critical paths. This access can be achieved by accessing write and read paths n pipeline stages away from the physical array. Physical mapping of arrays is required for best array test quality and soft cores will provide an address porting to allow the end user to re-configure address pins to match physical implementation once it is known.

ARM will provide an optional memory BIST controller in soft core implementations and will provide a custom implementation with hard cores (not optional). It is clear that every end customer has their own set of beliefs when it relates to memory BIST algorithms. It is ARM's goal to provide standard and custom algorithms which test for numerous fault classes and types. While these patterns may not perfectly match every end user's test methodology, they should be sufficiently robust such that the end user is not needing to create a new implementation.

There are two interfaces receiving special attention in this specification. First is the user interface. The user interface is specified with future expansion in mind. Use from core to core will remain the same, as will the primary instruction register that is loaded by this interface. This provides the same look and feel across the product line. The second interface exists at the memory access points. It is important to have a common interface among various cores to insure that the end user's own BIST solution can be configured for all future ARM cores with a common interface as well as meeting requirements for our internal BIST engine.

This document does not address specific ATPG test needs such as array bypass or controls but does include a couple of features that are required regardless of ATPG testability design style.

MBIST Architecture

ARM memory BIST strategy revolves around the ability to run testing with physically mapped arrays in order to leverage pattern effectiveness. Hard cores are always physically mapped in X (rows/distance to/from sense amp) and Y (column or sense amp selection) dimensions. Soft cores will have documented mappings of the memory test interface to the logical address provided at the core to memory interface. It will be a required exercise of the integrator (if they are to realize maximum test effectiveness) to either:

1) perform the physical mapping by scrambling the BIST_dispatch unit for each interface to match intended mapping
2) Force physical mapping in compiled rams to match the predefined ARM mapping The Memory BIST architecture will be centered around a single memory BIST test engine which distributes control signals to all arrays in the core. It is assumed that one memory BIST implementation will be created per core although it may be possible to integrate an engine across multiple cores. Providing two memory BIST engines per core is allowed but tester to memory BIST controller test interface must be managed and selected by the system integrator. Test signal distribution and routing impact is minimized by the use of a 4 bit dataword bus leaving the memory BIST controller. Dataword expansion and testing will occur at a specialized unit called mBIST_dispatch which acts as glue logic between the memory BIST controller and the memory BIST test interface. This glue logic performs address scrambling (mapping to physical space), specialized pipelining (local to targeted arrays), and dataword comparisons and test fail datalogging. This significantly reduces the excessive routing overhead usually associated with a centralized BIST controller.

The dispatch unit containing glue logic provides design specific implementations to be accommodated while enabling the memory test interface and BIST controller to be a fixed standard from design to design. End user test interface can be a standard from design to design by having a BIST controller that is off the shelf re-usable in all future ARM cores.

Memory BIST is launched by configuring the core's test interface to allow access to the memory BIST interface. Test algorithm progress (measured by address expire flags) and pass/fail status are continuously delivered on a 4 bit output only data bus (ported to macrocell). Further datalogging information can be obtained by shift access (using same external BIST interface) of the BIST controller or failing unit's dispatch unit. The amount of datalogging and trace support in the dispatch unit will be design dependant and maybe configurable.

Each memory BIST interface may support multiple ways. Each of these arrays will be supported as separate arrays in the BIST instruction register and failure log. During test execution, these arrays will also be tested by appending their enable lines to the Yaddr space. A BIST dispatch unit can accommodate mapping of enable lines to higher address bits if so enabled by the insertion register's enable lines. Note that this does not fit the usual definition of serial test or parallel test of these target arrays but the arrays are instead treated as segments of a larger whole array.

Figure 6:
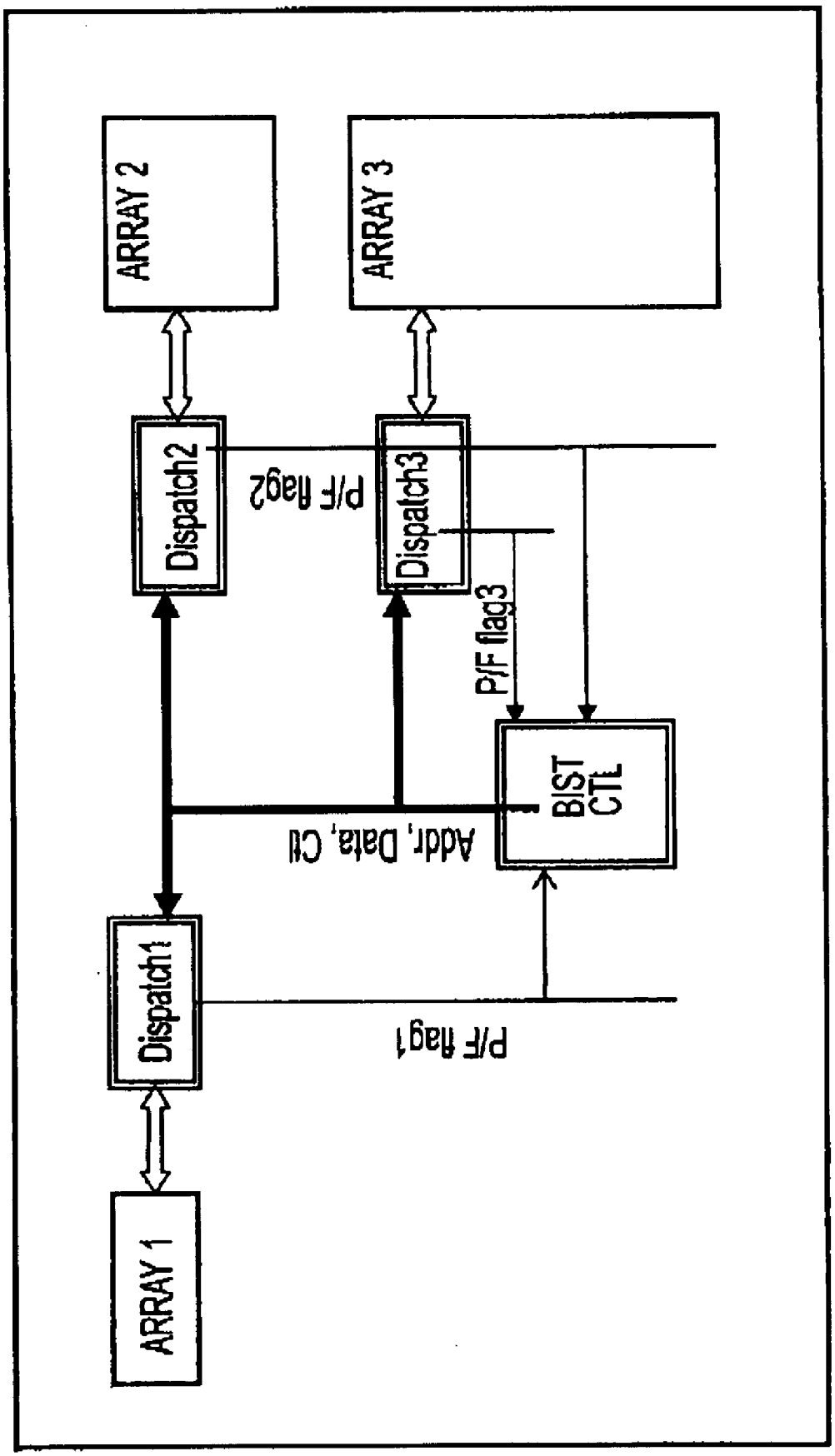
FIG. 6 schematically illustrates an MBIST user interface.

Centralized BIST Controller and Dispatch Units:

The MBIST User interface (test access to BIST Ctl) is illustrated in FIG. 6.

The MBIST test interface is defined by the below table. Of concern is the access mechanism for shift loading of the test configuration. This shift process will be performed on the core clock domain. As cores progress into the figure, this may require a pll switching mechanism to allow slow manual shift (due to tester interface limitations) and a switch to high speed pll clocking in order for memory test to occur speed (if clock rate exceeds the tester cycle or if pad timing limitations suppress maximum clocking speeds). It may make sense to implement a divide by four shifting clock for Jaguar in order to support future migration paths.

Test Interface to MBIST

| Core Port Signal | I/O, Size | Description |
| --- | --- | --- |
| MBIST_RUN | In | Memory testing launched by this signal |
| MBIST_SHIFT | In | Enables control register data load |
| MBIST_DIN | In | Provides serial load of control registers |
| SCANMODE | In | Disables overrides at dispatch units |
| MBIST_DOUT | Out, <3:0> | Provides runtime status <done, fail, Xexpire, Yexpire> |

The test configuration is loaded into a 32 bit register by asserting MBIST_SHIFT for 32 clocks and delivering LSB first, MSB last. MBIST_RUN MUST be inactive during this register load. Execution of register load terminates when MBIST_SHIFT is de-asserted. Assertion of MBIST_RUN will begin the memory test selected and test termination is signalled by the MBIST_DOUT<3> bit. MBIST_DOUT <1:0> will toggle during test to mark algorithm progress. MBIST_DOUT<2> or the fail bit will be sticky.

MBIST_SHIFT will be gated by MBIST_RUN to prevent unknown hazards in the engine.

MBIST_DOUT<0> doubles as the shift data out path of the instruction register whenever (MBIST_SHIFT & ~MBIST_RUN).

MBIST Instruction Register

Figure 7:
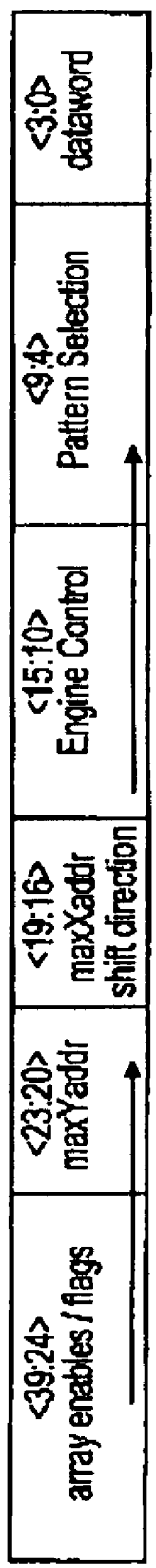
FIG. 7 schematically illustrates an MBIST instruction register.

Please refer to FIG. 7.

Array Enables and Flags <39:24>

Each tested array in the core will be assigned an enable bit as specified to the TRM document. This implementation is defined in this manner to account for the desire to test all arrays in parallel and to also allow flexibility to test arrays individually should the need arise. One example is the need to test only 50% of the arrays per pass due to maximum power concerns. Another possibility may include initializing different arrays to different background patterns for use in ATPG or in iddq. An array is not defined by the number of memory test interfaces but is defined by the number of individually tested arrays (note that a single memory test interface may have multiple array enables).

This portion of the instruction register also serves a second purpose. The outside user sees a single failure flag on the external interface. Scanout of this portion of the register, will reveal the P/F status of each array to further identify the failure array.

maxYaddr <23:20>

The maxYaddr field allows the user to specify the maximum Yaddr (a.k.a. column addr) to be used during test. This is especially useful when core derivatives of with varying cache sizes are employed or when different sized arrays within the core are to be tested. This bist controller architecure does not prevent multiple arrays of different sizes from being tested at the same time. To perform test of such scenarios, the user programs a maximum address size equal to the largest array and the dispatch unit blocks out of range addresses(by gating RE,WE) for the smaller array.

The following table describes the register settings and resulting address sizes:

| MaxYaddr | Size | BistYaddr active bits [11:0] |
|---|---|---|
| 0000 | 0 | 000000000000 |
| 0001 | 2 | 000000000001 |
| 0010 | 4 | 000000000011 |
| 0011 | 8 | 000000000111 |
| 0100 | 16 | 000000001111 |
| 0101 | 32 | 000000011111 |
| 0110 | 64 | 000000111111 |
| 0111 | 128 | 000001111111 |
| 1000 | 256 | 000011111111 |
| 1001 | 512 | 000111111111 |
| 1010 | 1k | 001111111111 |
| 1011 | 2k | 011111111111 |
| 1100 | 4k | 111111111111 |
| >1100 | — | Not supported | maxXaddr <19:16>

Similar to the Y address, the X address field selects the maximum number of addressable rows. Row depths beyond 512 are usually impractical due to bitline RC's but a space of up to 2 k is supported here if the user wishes to map planar features in the topology to the Xaddr spare (we recommend that planar or block addresses be mapped on top of Y address space, else bitline stress tests based on Xaddr space may lose effectiveness).

| MaxXaddr | Size | BistXaddr active bits [10:0] |
|---|---|---|
| 0000 | 0 | 00000000000 |
| 0001 | 2 | 00000000001 |
| 0010 | 4 | 00000000011 |
| 0011 | 8 | 00000000111 |
| 0100 | 16 | 00000001111 |
| 0101 | 32 | 00000011111 |
| 0110 | 64 | 00000111111 |
| 0111 | 128 | 00001111111 |
| 1000 | 256 | 00011111111 |
| 1001 | 512 | 00111111111 |
| 1010 | 1k | 01111111111 |
| 1011 | 2k | 11111111111 |
| 11xx | — | Not supported |

Engine Control <15:10>

The engine control portion of the register is used to specify special state machine behaviors such as stop on error. An <15:10>=0 setting specifies default behavior.

| <15:10> | Behavior | Description |
|---|---|---|
| 00 0000 | Default | Test runs to completion |
| 1x xxxx | Real Time Fail bit | Fail bit is real time, sticky fail appears at end of test |
| xx 0001 | Stop on fail | Stops on fail with <16 cycle latency |
| xx 0010 | Stop at end of algorithm if fail | Stops on fail after current algorithm "N" is completed |
| 00 1110 | Load dispatch unit instruction | Scan dispatch unit as selected by one hot <31:16> |
| 00 1111 | Read dispatch unit datalog | Scan dispatch unit as selected by one hot <31:16> |

The real time failure bit is provided for lab use should the test/lab personnel wish to monitor soft fail behaviors.

Stop at end of algorithm pass is provided as a means to allow testing to progress until end of a failing algorithm segment. This may be useful for bitmapping if the dispatch unit provides scannable test access mechanisms for downloading all array entries.

Scanning of dispatch unit will place selected dispatch unit scan ports between MBIST_DIN and MBIST_D0UT when MBIST_RUN is asserted. Access is disabled once MBIST_RUN is de-asserted. Any operation loaded into dispatch unit will be executed at time of MBIST_RUN de-assertion. (Note: I need to better define handshake to allow maximum efficiency and also proper function as mBIST_run will require warm-up cycles and must allow enough time for the operation to complete, would probably be ok if I delayed internal override releases by appropriate cycle counts).

Dispatch units are loosely defined at this time and will be built to core's need. They should provide minimum datalogging information, such as first fail address and fail bit. This information should be accessible by the dispatch datalog scan operation. Use of scannable dispatch unit instructions is optional.

Pattern/Algorithm Selection <9:4>

Numerous standard patterns and ARM created bitline stress patterns are provided for use in test. Algorithms are created in pieces to allow for maximum flexibility in unknown final test design. Areas of test supported include go/nogo, iddq data retention, ATPG, gross function test, and stress testing. The following table describes supported patterns and later paragraphs describe their use. Use of segmented testing can be used to maximize softbin and yield tracking information in the fab and to provide the end test design to best match the fab's memory test own beliefs.

| <5:0> selection | Name | "N" | Description |
|---|---|---|---|
| 00000 | WriteSolids | 1N | Write specified dataword into all entries |
| 00001 | ReadSolids | 1N | Read dataword from all entries |
| 00010 | WriteCkbd | 1N | Data or databar selected by X<0> ^ Y<0> |
| 00011 | ReadCkbd | 1N | Data or databar selected by X<0> ^ Y<0> |
| 00100 | March C+ | 14N | Increment decrement XY fast RWR march |
| 00101 | PttnFail | 6N | Tests BIST failure detection |
| 00110 | RW_Xmarch | 6N | Increment decrement wordline fast march |
| 00111 | RW_Ymarch | 6N | Increment decrement bitline fast march |
| 01000 | RWR_Xmarch | 8N | Increment decrement wordline fast march |

-continued

| <5:0> selection | Name | "N" | Description |
|---|---|---|---|
| 01001 | RWR_Ymarch | 8N | Increment decrement bitline fast march |
| 01010 | Bang | 18N | Increment decrement wordline fast bitline stress |
| 11111 | Go/No Go | 30N | 2*W/RCkbd, RWR Ymarch, X Bang |

Definitions:
column → dimension in array parallel to bitlines (on the same SenseAMP)
row → dimension in array parallel to wordlines
row fast/Xfast → target cell moves along bitlines before moving to next column
col fast/Yfast → target cell moves across bitline pairs before row/wordline
Xfast Increment → target cell begins nearest sense amp, moves away
Xfast Decrement → target cell begins furthest point from sense amp, moves closer
Yfast Increment → Yaddr space moves from 0 to max, east-west relationship
Yfast Decrement → Yaddr space moves from max to 0, opposite of increment
N → Number of addressable entries Definitions:
  column →dimension in array parallel to bitlines (on the same SenseAMP)
  row →dimension in array parallel to wordlines
  row fast/Xfast →target cell moves along bitlines before moving to next column
  vol fast/Yfast →target cell moves across bitline pairs before row/wordline
  Xfast Increment →target cell begins nearest sense amp, moves away
  Xfast Decrement →target cell begins furthest point from sense amp, moves closer
  Yfast Increment →Yaddr space moves from 0 to max, east-west relationship
  Yfast Decrement →Yaddr space mows from max to 0, opposite of increment
  N →Number of addressable entries BIST Pattern Specification All memory BIST tests are executed against physically mapped address space. this simply means that the least significant Xaddr switches between adjacent rows (LSB+1 switches between every 2nd row, and so on). Yaddr space is also physically mapped. This allows for efficient and direct targeting of memory faults with the supplied patterns.

"writeCkbd" is performed Xfast. This pattern is 1N, writing only. Data polarity set by xor(Xaddr[0],Yaddr[0]).

"Read Ckbd" is performed Xfast. This pattern is 1N, reading only. Data polarity set by xor(Xaddr[0],Yaddr[0]).

"writeSolids" is performed Xfast. This pattern is 1N, writing only. Data polarity =true.

"Readsolids" is performed Xfast. This pattern is 1N, reading only. Data polarity =true.

"MarchC+" is performed Xfast with the following sequence:
  1) write solids (initialize array) incr
  2) Rdata, Wdatabar, Rdatabar incr
  3) Rdatabar, Wdata, Rdata incr
  4) Rdata, Wdatabar, Rdatabar decr
  5) Rdatabar, Wdata, Rdata decr
  6) Rdata verify decr "RWR_Xmarch" is performed Xfast with the following sequence...
  1) write solid (initialize array)
  2) Rdata/Wdatabar/Rdatabar inc
  3) Rdatabar/Wdata/Rdata decrement
  4) Rdata solid "RWR_Ymarch" has the same sequence as RWR_Xmarch but is performed Yfast.

"RW_Xmarch" is performed Xfast. This 6N pattern has the following sequence...
  1) write solid (initialize array)
  2) Rdata/Wdatabar inc
  3) Rdatabar/Wdata decrement
  4) Rdata solid "RW_Ymarch" is 6N and performed Yfast with the same sequence as RW_Xmarch. "pttnFail" is performed Xfast. Executes a writeSolid pattern followed by a ReadSolid. Fails are injected by reversing data polarity on select addresses during ReadSolid. This pattern is REQUIRED to insure BIST detection logic (at target array) is functional. "bang", 18N, is performed Xfast, executing consecutive multiple writes and reads on a bitline pair.
  1) write solid (initialize array)
  *2) read data target, write databar target, 6 write databar row 0, increment to next target Xfast
    * This segment "bangs" bitline pairs insuring proper equalization after writes. Insufficient equalization/precharge will result in a slow read when opposite data is read from the same bitline pair. Slow reads in self timed caches result in functional failure not found in popular "single shot" algorithms like March C.
  **3)5*read databar target, write data row 0, read databar target, write data target
    ** This segment attempts to walk down a bitcell, write opposite data on that bitline pair, read target cell data. This failure mechanism is less common in 6T ram cells (vs. 4T or DRAM).
  4) read data (verify array)
  *,**Use of the "sacrificial" row, also helps detect open decoder faults in the space (YaddR not subject to fault class architecturally because of smaller decode blocks) in absence of graycode pattern sequences.
  *,**This pattern does detect stuck at fault, but its primary intent is to address the memories' analog characteristics. "go/nogo", 30N is the ARM test suite selected for memory tests should the end user not desire to implement their own test strategy. Selection of this pattern will result in the following tests to be executed as listed below. This provides the end user a pass fail status for the array. The below test suite provides a comprehensive functional test of the arrays (data retention and other stress tests not included). The series of tests in go nogo are the culmination of internal ARM memory test engineers' past experiences in memory test.
  1) Performwckbd 5's
  2) Rckbd 5's
  3) Wckbd a's
  4) Rckbd a's
  5) RWR Ymarch 6's
  6) Bang 0's DataWord <3:0>

At test instruction load, the user specifies the root dataword used during the test algorithm (exception during go/nogo BIST algorithm). This allows the user to select values stored into initialised arrays (iddq or ATPG) or to select new datawords to search for unexpected sensitivities during march and bitline stress tests.

MBIST Memory Interface

The memory interface is defined in the below table. Its use is required for all memory devices on a core, regardless of whether or not ARM provides the memory for that core. This will allow the user to make use of the ARM BIST controller without special modifications. ATPG related support is also defined here.

| Signal | I/O, Size | Description |
|---|---|---|
| MTestSel | In, <?:0> | Optional, Used for serial test of multiple downstream arrays |
| MTestWEx | In | Dictates write operation |
| MTestREx | In | Dictates read operation |
| MTestADDR* | In, <maxAddr:0> | Target Address |
| MTestDINx | In, <datawidth:0> | BIST Write Data |
| MTestDOUTy | Out, <datawidth:0> | BIST read Data |
| MTestON | In | Global Override of cache logic |
| ArrayDisable | In | Blocks all array activity, regardless of operation mode |

*May have single Address bus if mBIST_dispatch handles all scrambling concerns. This is still being thought out.

Memory BIST Interface Definitions

"MTestSel<?:0>"

Should a memory BIST interface support more than one downstream array, separate enables are required to select array being targeted. This signal may also be required for a single array that has multiple repairable areas. A single array interface does not require use or porting of this signal.

"MTestWEx"

This signal (if not blocked internally by MTestSel or MTestON) indicates a write operation is being delivered to the memory test array interface. Address and Data information will be delivered coincident with this signal. If a write operation takes two cycles to complete, this signal is designated "MTestWE2". If multiple arrays are supported by the interface, all with varying pipeline delays, the x designation shall be used ("MTestWEx"). Use of the pipeline delay length in the signal name allows for easier BIST integration by the BIST interface unit or end users own implementation.

"MTestREx"

Read enable for array under test. See MTestWEx signal for further information.

"MTestADDR<?:0>*"

Address being targeted in array under test. Signal is as wide as maximum number of addressable elements in targeted arrays.
* May have single Address bus if mBIST_dispatch handles all scrambling concerns. This is still being thought out.

"MTestDINx, MTestDOUTy"

Data in and data out ports for BIST operations. MBISTDOUT delivered "x+y" cycles later as defined by MBISTREx. Example: An MBIST_RE3 specifies that the read operation will occur 3 clocks after MBISTRE3 information is asserted. The dataout pipeline may have its own offset and is represented by "y". If multiple arrays are supported by a single interface, and some arrays have smaller data widths than the maximum array width, the memory BIST interface shall be required to deliver "0" on all unused data bits for all read operations. If datain and dataout busses have varying pipeline offsets depending on downstream array, they shall have an offset designated by "x".

"MTestON"

This is a global override signal, informing the interface and downstream logic that BIST operations are imminent. This signal is the second highest priority signal in cache logic, behind ScanMode/ScanEn. Normal function/mission mode operation is a LOWER priority operation.

"ArrayDisable"

ATPG signal, blocking writes and reads to all arrays whenever active Blocking must occur after all scannable state elements to insure safety of array's initialized data. This signal is generated in the memory BIST dispatch unit and is the "or'd" function of IDDQtest and ScanEn. IDDQtest used to insure preservation of state during iddq scan and capture, scanEn used to preserve state during ATPG load/unload should ATPG ram tests be implemented.

MBIST Interface Design Rules

MTestON overrides all normal function operations.

MTestON is asserted at least 4 cycles prior to first operation and not released until after last operation completes. Remains static "on" for duration of BIST test.

ArrayDisable blocks all write/read activity, regardless of device mode (functional, ATPG, BIST,etc.) and occurs after last scannable state elements.

A BIST no-op (no operation) can and will occur. Defined as BIST cycle where RE/WE are both inactive Back to back operations must be supported and expected in any combination of R/W/Addr All operation data provided from F/F's and read data will be sampled into F/F's. (mBIST is a flop based design)

All BIST operations can occur at full speed.

Addr and RE/WE signals are provided in same clock cycle. Datain may be injected at different stage if required. All RE/WE/Data signals must have cycle suffix designator as specified in signal descriptions.

All read operations must be completed within 8 cycles from RE assertion to dataout. (pipeline injection points must be reasonable).

If multiple arrays are supported by interface, address and data adjustments will occur in dispatch unit (example: addressed array is smaller than BIST_engine... BIST_dispatch will block RB/WE for out of range addresses)

All Variable sized arrays must be right justified in addressing wrt to incoming BISTADDR where rightmost bit is LSB.

ONLY ArrayDisable and MTestON can be assumed to toggle without regard to operation setup/hold times. All other control signals at interface must be considered unknown from cycle to cycle.

No address scrambling allowed between mBIST interface and actual array interface. Scrambling will occur in the dispatch unit.

Physical mapping characteristics must be maintained on all arrays downstream of each unique array interface. (Xaddr LSB always selects between adjacent rows regardless of array supported by given interface).

MBIST Dispatch Units

A dispatch unit is required between every BIST controller to memory test interface. This block serves as glue logic between a standardized front end BIST controller and a standardized memory test interface. It also provides manual debug accesses to the array and performs data compare and datalogging of the read data from the test interface.

Dispatch Unit interface

The following table describes the incoming and outgoing interface signals of the mBIST_dispatch unit:

| Input/O Data from Memory BIST controller | | I/Output to memory test interface | |
|---|---|---|---|
| Signal | Description | Signal | Description |
| ArrayEn<?:0> | Enables target arrays (instr reg) | MTestSel | Array enables to interface |
| BISTTest | Game on | MTestWEx | Array write enable |
| MBISTData<3:0> | Write/read data | MTestREx | Array Read Enable |
| MBISTXaddr<?:0> | BIST Controller Wordline Addr | MTestADDR* | Array cell select |
| MBISTYaddr<?:0> | BIST Controller bitline Addr | | |
| MBISTWE | BIST Controller write enable | MTestDINx | Array Data in (full width) |
| MBISTRE | BIST Controller read enable | MTestDOUTy | Array Data out (full width) |
| MBISTShiftI | Shiftenable for dispatch instr | MTestON | Array test override |
| MBISTShiftD | Shiftenable for datalog | ArrayDisable | Array access blocking |
| DispatchDin | Shift data in | | |
| DispatchDout | Shift data out | | |
| IddqTest | IddqTest mode | | |
| SE | Scan enable input | | |
| SCANMODE | ATPG testing mode | | |
| MBISTFail<?:0> | Fail bits sent to main controller | | |

Notes:
1. BISTData<3:0> is linearally expanded across full memory bit width. Pipelining of this data inside of dispatch unit is done as <3:0> and expanded as needed. This expanded word is used to drive or compare the full bus width of the memory under test.
2. DispatchDout follows LSB of dispatch unit's instr or datalog register (as selected by shiftenable)
3. The memory test interface shall be driven by the dispatch unit and ONLY the dispatch unit for all defined signals (no direct connect to BIST controller as dispatch unit pipelines controller data for timing safety).
4. Support of instruction register capability inside dispatch is design specific. Datalogging/Repair information is generated and maintained in dispatch unit and is design implementation specific.
5. Multiple enable selected arrays can be tested simultaneously by mapping enables to higher order Yaddress. This is highly desirable for go/nogo testing.

Address Scrambling

Hard cores will have known physical to logical mapping of address spaces and will need to be scrambled accordingly in the BIST_dispatch unit. This is performed at the dispatch unit as address scrambling requirements may differ for different memory test interfaces.

Softcores and compiled rams will not have known addressing up front and scrambling cannot be performed in rtl, especially if the core design is synthesized prior to compilation of memories. Scrambling will be required to insure physical mapping exists with the ARM BIST algorithms. This is accomplished by adding 2 additional ports of the TestADDR to the dispatch unit. These ports represent the BIST controller address and the second represents the scrambled version of address going to the MtestAddr interface, These ports are brought up to the highest hardened level of the design and scrambling occurs by stitching the controller address to the test address as required. This stitching becomes the responsibility of the core integrator.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data, said apparatus comprising:
    at least one memory having a plurality of memory storage locations associated with respective memory addresses; and
    a self-test controller operable to control self-test of said at least one memory; wherein
    said self-test controller is responsive to a self-test instruction specifying a test methodology to be applied to perform at least one memory access to each memory location within a sequence of memory storage locations, memory address changes between successive memory locations accessed within said sequence of memory storage locations being selected in dependence upon said self-test instruction such that said self-test controller may be configured by said self-test instruction to implement different memory test methodologies.

2. Apparatus as claimed in claim 1, wherein said self-test controller is operable to execute a plurality of self-test instructions to perform a sequence of memory tests,
    said self-test instructions being programmable to allow different sequences of memory tests to be specified by different users.

3. Apparatus as claimed in claim 2, wherein said sequence of memory tests may be changed to match different memories.

4. Apparatus as claimed in claim 2, wherein said sequence of memory tests may be changed to match different fabrication characteristics and test needs.

5. Apparatus as claimed in claim 1, wherein said memory addresses are physical row and column addresses within said at least one memory.

6. Apparatus as claimed in claim 1, wherein said self-test instruction specifies data to be written to said memory as part of said at least one memory access.

7. Apparatus as claimed in claim 1, wherein said memory address changes between successive memory locations as selected in dependence upon said self-test instruction and said self-test controller allow one or more of the following memory test operations to be performed:
   (i) write specified data to all memory locations within a range of memory addresses;
   (ii) read data from all memory locations within a range of memory addresses;
   (iii) write specified data to memory locations having a checkerboard pattern of memory addresses;
   (iv) read data from memory locations having a checkerboard pattern of memory addresses;
   (v) conduct a march C memory test;
   (vi) read data from and write specified data to a sequence of memory locations within a memory arranged in rows and columns of memory locations such that memory locations within a row of memory locations are accessed in turn before a next row of memory locations is selected for access;
   (vii) read data from and write specified data to a sequence of memory locations within a memory arranged in rows and columns of memory locations such that memory locations within a column of memory locations are accessed in turn before a next column of memory locations is selected for access;
   (viii) read data from, write specified data to and read data from a sequence of memory locations within a memory arranged in rows and columns of memory locations such that memory locations within a row of memory locations are accessed in turn before a next row of memory locations is selected for access;
   (ix) read data from, write specified data to and read data from a sequence of memory locations within a memory arranged in rows and columns of memory locations such that memory locations within a column of memory locations are accessed in turn before a next column of memory locations is selected for access;
   (x) for a sequence of memory locations, repeatedly write a value to one or more bitlines within said memory and then read a complementary value stored within a memory location sharing said one or more bitlines;
   (xi) for a sequence of memory locations, repeatedly read a value from a memory location while interjecting opposing data writes;
   (xii) a predetermined combination of memory test operations as defined in (i) to (xi) for go/nogo testing where manufacture's test methods do not have specific requirements; and
   (xiii) creating false read data at specific points in order to validate fail detection.

8. Apparatus as claimed in claim 1, further comprising a processor core, wherein said processor core, said at least one memory and said self-test controller are formed together on an integrated circuit.

9. Apparatus as claimed in claim 1, wherein said at least one memory is a synthesized memory or a custom memory.

10. Apparatus as claimed in claim 1, wherein an interface circuit is disposed between said self-test controller and said at least one memory, said interface circuit serving to adjust values and timings of signals passed between said self-test controller and said at least one memory to accommodate differing value and timing properties of said at least one memory.

11. Apparatus as claimed in claim 10, wherein said interface circuit maps a memory address value generated by said self-test controller to a logical address value to be input to said at least one memory.

12. Apparatus as claimed in claim 1, comprising a plurality of memories and said self-test instruction specifies to which of said plurality of memories said self-test instruction is to be applied.

13. Apparatus as claimed in claim 1, wherein said self-test instruction specifies how a detected memory error is to be reported by said self-test controller.

14. Apparatus as claimed in claim 10, wherein said interface circuit includes a result data register in which result data from testing said at least one memory may be captured and said self-test controller is responsive to a self-test instruction to read result data from said result data register.

15. Apparatus as claimed in claim 1, wherein said self-test instruction specifies a size of said at least one memory to be tested.

16. Apparatus as claimed in claim 1, wherein said self-test instruction is serially loaded into said self-test controller.

17. Apparatus as claimed in claim 1, wherein said at least one memory and said self-test controller are formed together on an integrated circuit having a plurality of external signal pins, said self-test controller having one or more external signal pins through which one or more self-test instructions may be applied to said self-test controller.

18. A method of testing a memory having a plurality of memory storage locations associated with respective memory addresses, said method comprising the steps of:
   passing a self-test instruction to a self-test controller coupled to said memory, said self-test instruction specifying a test methodology to be applied; and
   in response to said self-test instruction, performing at least one memory access to each memory location within a sequence of memory storage locations, memory address changes between successive memory locations accessed within said sequence of memory storage locations being selected in dependence upon said self-test instruction such that said self-test controller may be configured by said self-test instruction to implement different memory test methodologies.

19. A method as claimed in claim 18, comprising executing a plurality of self-test instructions with said self-test controller to perform a sequence of memory tests, said self-test instructions being programmable to allow different sequences of memory tests to be specified by different users.

20. A method as claimed in claim 19, wherein said sequence of memory tests may be changed to match different memories.

21. A method as claimed in claim 19, wherein said sequence of memory tests may be changed to match different fabrication characteristics and test needs.

22. A method as claimed in claim 18, wherein said memory addresses are physical row and column addresses within said memory.

23. A method as claimed in claim 18, wherein said self-test instruction specifies data to be written to said memory as part of said at least one memory access.

24. A method as claimed in claim 18, wherein said memory address changes between successive memory locations as selected in dependence upon said self-test instruction and said self-test controller allow one or more of the following memory test operations to be performed:
   (i) write specified data to all memory locations within a range of memory addresses;

(ii) read data from all memory locations within a range of memory addresses;
(iii) write specified data to memory locations having a checkerboard pattern of memory addresses;
(iv) read data from memory locations having a checkerboard pattern of memory addresses;
(v) conduct a march C memory test;
(vi) read data from and write specified data to a sequence of memory locations within a memory arranged in rows and columns of memory locations such that memory locations within a row of memory locations are accessed in turn before a next row of memory locations is selected for access;
(vii) read data from and write specified data to a sequence of memory locations within a memory arranged in rows and columns of memory locations such that memory locations within a column of memory locations are accessed in turn before a next column of memory locations is selected for access;
(viii) read data from, write specified data to and read data from a sequence of memory locations within a memory arranged in rows and columns of memory locations such that memory locations within a row of memory locations are accessed in turn before a next row of memory locations is selected for access;
(ix) read data from, write specified data to and read data from a sequence of memory locations within a memory arranged in rows and columns of memory locations such that memory locations within a column of memory locations are accessed in turn before a next column of memory locations is selected for access;
(x) for a sequence of memory locations, repeatedly write a value to one or more bitlines within said memory and then read a complementary value stored within a memory location sharing said one or more bitlines;
(xi) for a sequence of memory locations, repeatedly read a value from a memory location while interjecting opposing data writes;
(xii) a predetermined combination of memory test operations as defined in (i) to (xi) for go/nogo testing where manufacture's test methods do not have specific requirements; and
(xiii) creating false read data at specific points in order to validate fail detection.

25. A method as claimed in claim 18, wherein said memory and said self-test controller formed together with a processor core on an integrated circuit.

26. A method as claimed in claim 18, wherein said memory is a synthesized memory or a custom memory.

27. A method as claimed in claim 18, wherein values and timings of signals passed between said self-test controller and said memory are adjusted by an interface circuit disposed between said self-test controller and said at least one memory in order to accommodate differing value and timing properties of said at least one memory.

28. A method as claimed in claim 27, wherein said interface circuit maps a memory address value generated by said self-test controller to a logical address value to be input to said memory.

29. A method as claimed in claim 18, wherein said self-test instruction specifies to which of a plurality of memories said self-test instruction applies.

30. A method as claimed in claim 18, wherein said self-test instruction specifies how a detected memory error is to be reported by
said self-test controller.

31. A method as claimed in claim 27, wherein said interface circuit includes a result data register in which result data from testing said memory may be captured and said self-test controller is responsive to a self-test instruction to read result data from said result data register.

32. A method as claimed in claim 18, wherein said self-test instruction specifies a size of said memory to be tested.

33. A method as claimed in claim 18, wherein said self-test instruction is serially loaded into said self-test controller.

34. A method as claimed in claim 18, wherein said memory and said self-test controller are formed together on an integrated circuit having a plurality of external signal pins, said self-test controller having one or more external signal pins through which one or more self-test instructions may be applied to said self-test controller.

* * * * *